US006281701B1

(12) United States Patent
Yang et al.

(10) Patent No.: US 6,281,701 B1
(45) Date of Patent: Aug. 28, 2001

(54) APPARATUS FOR TESTING FLAT PANEL DISPLAY

(75) Inventors: Jenn-Fang Yang; Wen-Jyh Sah; Chin-Lung Ting, all of Jen Te (TW)

(73) Assignee: Chi Mei Optoelectronics Corporation (TW)

( * ) Notice: Subject to any disclaimer, the term of this patent is extended or adjusted under 35 U.S.C. 154(b) by 0 days.

(21) Appl. No.: 09/325,771

(22) Filed: Jun. 4, 1999

(51) Int. Cl.[7] ............................ G01R 31/00; G01R 31/02
(52) U.S. Cl. ........................... 324/770; 324/761; 324/233
(58) Field of Search .................................... 324/770, 761, 324/233; 349/42, 187, 143

(56) References Cited

U.S. PATENT DOCUMENTS

| | | | | |
|---|---|---|---|---|
| 5,113,134 | * | 5/1992 | Plus et al. | 324/770 |
| 5,355,080 | * | 10/1994 | Sato et al. | 324/761 |
| 5,378,982 | * | 1/1995 | Feigenbaum et al. | 324/770 |
| 5,546,013 | * | 8/1996 | Ichioka et al. | 324/770 |
| 5,719,648 | * | 2/1998 | Yoshii et al. | 349/42 |
| 5,811,970 | * | 9/1998 | Cook et al. | 324/233 |
| 5,825,196 | * | 10/1998 | Irie et al. | 324/770 |

* cited by examiner

*Primary Examiner*—Safet Metjahic
*Assistant Examiner*—Wasseem H. Hamdan

(57) ABSTRACT

Apparatus for testing flat panel display (liquid crystal display) panel is disclosed herein. Testing apparatus for sending a plurality of electrical signals to a plurality of pads of a display panel, the testing apparatus includes the following devices. A plurality of probe pins is used to contact the plurality of pads of the display panel. The amount of the plurality of probe pins in the present invention is larger than the amount of the plurality of pads, besides, the pitches between the plurality of probe pins is smaller than the width of etch of the plurality of pads of the display panel. The signal generating means is used to generate the signals to be sent to the plurality of pads of the display panel through the plurality of probe pins. The switching means is used to provide the conductive paths between the signal generating means and the plurality of probe pins.

4 Claims, 4 Drawing Sheets

APPARATUS FOR TESTING FLAT PANEL DISPLAY

BACKGROUND OF THE INVENTION

1. Field of the Invention

This invention relates to apparatus for testing flat panel display, and particularly relates to apparatus for testing liquid crystal display (LCD).

2. Description of the Prior Art

As the trend of shrinking volume of electrical device and reducing radiation produced by the display device, the cathode ray tube (CRT) display is gradually replaced with the flat panel display. But the technology for fabricating the flat panel display device results in the high cost of the flat panel display device, which confines the use of flat panel display device. After a long term of developing the fabricating technology for manufacturing flat panel display device, such as LCD, the yield of fabricating LCD is raised, and the technology is getting mature day by day. In recent years, application of flat panel display devices to word processors, lap-top personal computers, pocket size TV display, and the like have been rapid progress. Especially, the liquid crystal display (LCD) is widely used in every kinds of application due to the maturity of process that fabricating the LCD panel.

In early years, because LCD is very expensive, and the technology is immature, the application of LCD is only in a narrow field, thus only few sizes of LCD is utilized in few applications. As the fabrication technology progressed, the yield of fabricating LCD is raised, and cost is down gradually. So the application of LCD is getting more wide, and the size of LCD is getting larger. To replace the CRT display, the enlargement of the area of the LCD panel is necessary, so the technology used to fabricate the large size LCD panel is developed. Though the large size LCD is getting more popular, the application of small size LCD is unavoidable.

Because the LCD panel is composed of many LCD cells and other devices, in addition, the larger LCD panel has more devices. Even a single device in the LCD panel is out of order, the whole LCD panel is thus fail. So the test for the fabricated LCD panel is a very important step to ensure the quality of the fabricated LCD panel before packaging. To verify whether the fabricated LCD panel can work properly, the probe card is utilized to test the fabricated LCD panel. In earlier years, only few kinds of LCD sizes are utilized in application, so only few kinds of sizes of probe card are utilized to test the LCD panel. Though only few kinds of sizes of probe card are utilized, and each size of probe card is designed for a specific LCD size, because few sizes of LCD panel are utilized, so that few sizes of probe card are enough.

Due to various applications of LCD panel, the LCD panel of various sizes are developed, and the probe card of corresponding sizes are designed and fabricated to test the LCD panel of corresponding size. Whereas in the LCD panel factory, one test station can only test LCD panels of one specific size. If the size of the produced LCD panel is to be changed, the probe card must be replaced to fit the new size of the produced LCD panel. To illustrate the operation of the prior art probe card utilized to test the flat panel display, such as LCD panel, the configuration of the prior art LCD panel testing device is illustrated in FIG. 1*a*, in which the probe card is utilized. As shown in FIG. 1*a*, the LCD panel testing device includes the pattern generator 10, the control board 13, the scan circuit board 15, the data circuit board 17, and the probe card 19. Besides the LCD panel that is to be tested is LCD panel 25. When testing the LCD panel 25, the pattern generator 10 generates the pattern that is to be shown in the display panel (LCD panel 25). The control board 13 feeds a data line driving signal ds to the data circuit board 17 and feeds a scan line driving signal ss to the scan circuit board 15 respectively according to the output signal of the pattern generator 10. The scan circuit board 15 feeds the scan line driving pulse sp to the probe card 19 responding to the scan line driving signal ss, and feeds the data line driving pulse dp to the probe card 19 responding to the data line driving signal ds.

To further illustrate the operation of testing the LCD panel, the amplified view of the area in the dashed circle D in FIG. 1*a* is shown in FIG. 1*b*. In which a plurality of probe pin 27 is electrically coupled to the edge of probe card respectively, and the other terminal of each of the plurality of probe pin 27 is also electrically coupled to the pad 30 of the LCD panel 25 by physical touching. So the devices in the LCD panel can be tested by the LCD panel testing device through the probe card 19. For the description mentioned above, the number of pin 27 of the probe card 19 is fixed and the size of the probe card 19 is fixed. If a new LCD panel has a larger size than that of the original LCD panel, it is impossible to use the original probe card to test the LCD panel of a larger size. Also, if the size of the fabricated LCD panel of the production line is to be changed. In other words, when the production line is used to fabricate the LCD panel of the other size, then the probe card on the production line must be changed to a specific size that fits for the of the other size of LCD panel. It takes about 1–2 hours to change the probe card of the production line, and it's a long time wasted in fabricating LCD panel.

In addition, in developing a specific LCD panel, it is necessary to test the fabricated specific LCD panel, so the purchase of the probe card of corresponding specification is necessary. Whereas each probe card costs about 10,000 US dollars, its very expensive, and if the developed specific LCD panel is not to be mass produced, the probe card of corresponding specification will become useless, thus the waste of investment is resulted. Furthermore, as the technology advances getting more quickly, LCD of one specification will probably be replaced with LCD of another specification within the lifetime of the ordinary probe card. So the replacement of a new probe card is necessary, and the ordinary probe card become useless.

Besides, it takes about two months for the probe card maker from getting an order for purchasing a probe card to realizing the designed probe card. If the foregoing duration can be saved, it makes benefit in developing the LCD of a new specification. In other words, the duration of developing a LCD panel of a new specification is reduced. According to the disadvantages mentioned above, the prior art probe card needs improvement.

SUMMARY OF THE INVENTION

Apparatus for testing flat panel display (liquid crystal display) panel is disclosed herein. The testing apparatus for sending a plurality of electrical signals to a plurality of pads of a display panel, the testing apparatus includes the following devices. A plurality of probe pins is used to contact the plurality of pads of the display panel. The amount of the plurality of probe pins in the present invention is larger than the amount of the plurality of pads, besides, the pitches between the plurality of probe pins is smaller than the width of etch of the plurality of pads of the display panel. The signal generating means is used to generate the signals to be sent to the plurality of pads of the display panel through the plurality of probe pins. The switching means is used to provide the conductive paths between the signal generating means and the plurality of probe pins.

Generally speaking, the tested display panel can be a liquid crystal display panel. In one preferred embodiment of the present invention, the switching means can includes contact detection means, processing means, and matching means. The contact detection means is used to detect which of the plurality of probe pins are in contact with the plurality of pads. The processing means is used to provide a decoded signal representing a mapping relation between the signals to be sent to the display panel and the plurality of probe pins in contact with the plurality of pads according to the result of the contact detection means. The matching means is used to provides conductive paths between the signal generating means and the plurality of pads of the display panel.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

To improve the prior art probe card for testing whether every device of a flat panel display can work properly, the present invention proposes apparatus for testing flat panel display. The preferred embodiment of the present invention use apparatus for testing LCD panel as an example to illustrate how the apparatus according to one preferred embodiment of the present invention works.

Figure 1A:
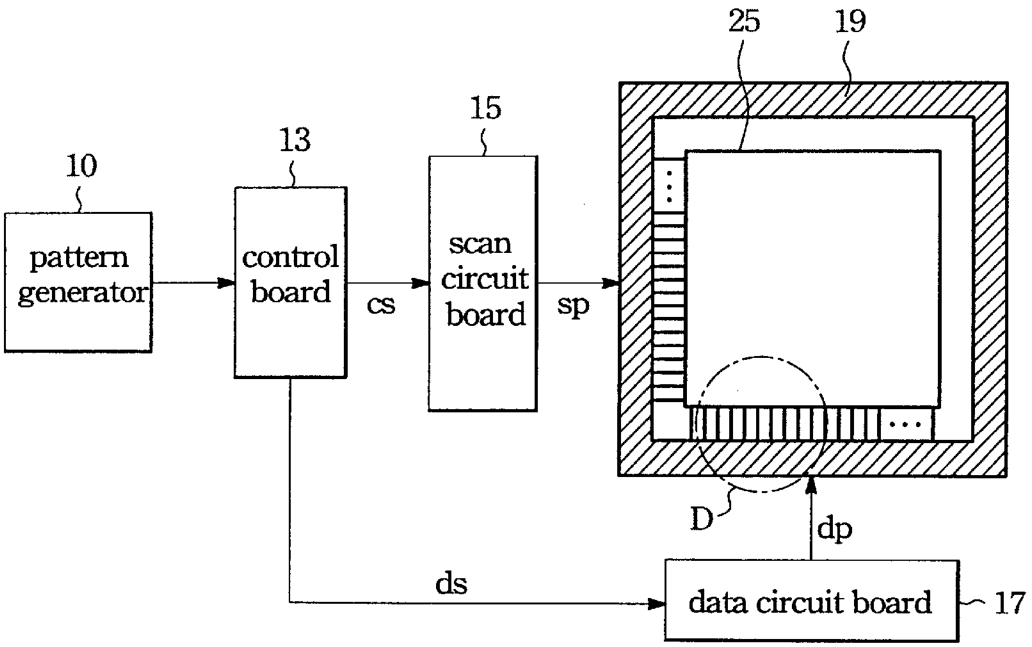
Fig.1a (Prior Art)
FIG. 1*a* illustrates the configuration of the prior art testing apparatus for testing the display panel.
Figure 1B:
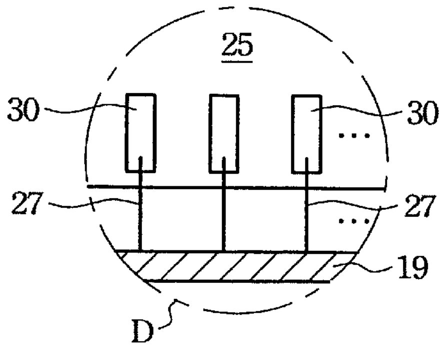
Fig.1b (Prior Art)
FIG. 1*b* illustrates the amplified view of a portion of the configuration of the prior art testing apparatus.
Figure 2A:
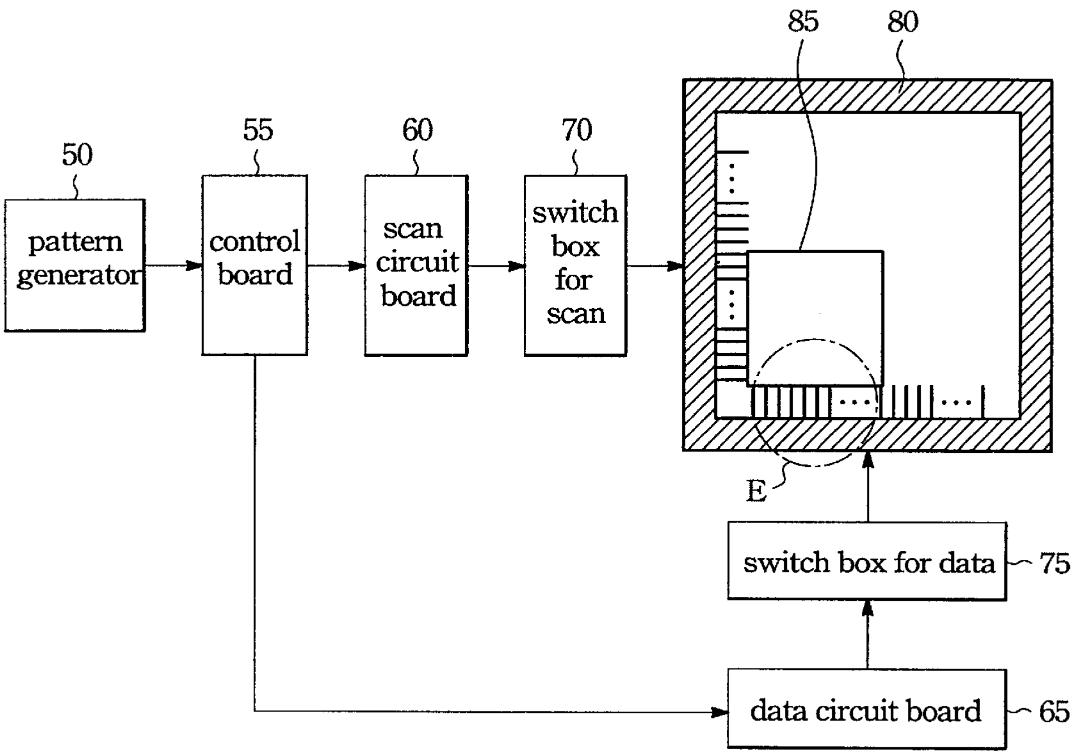
FIG. 2*a* illustrates the configuration of the testing apparatus according to one preferred embodiment of the present invention.

To illustrate the operation of the apparatus for testing the flat panel display, such as LCD panel, the configuration of the LCD panel testing device is illustrated in FIG. 2*a*, in which the probe card is utilized according to one preferred embodiment of the present invention. As shown in FIG. 2*a*, the LCD panel testing apparatus includes the pattern generator 50, the control board 55, the scan circuit board 60, the data circuit board 65, the switching box for scan 70, the switching box for data 75, and the probe card 80. In addition, in the preferred embodiment of the present invention shown in FIG. 2A, the LCD panel that is to be tested is LCD panel 85. When testing the LCD panel 85, the pattern generator 50 generates the pattern that is to be shown in the display panel (LCD panel 85). The control board 55 feeds a data line driving signal ds to the data circuit board 65 and feeds a scan line driving signal ss to the scan circuit board 60 respectively according to the output signal of the pattern generator 50. The scan circuit board 60 feeds the scan line driving pulse sp to the switch box for scan 70 responding to the scan line driving signal ss, and feeds the data line driving pulse dp to the switching box for data 75 responding to the data line driving signal ds. Then the switch box for scan 70 feeds the predetermined scan line testing pulse st to the probe card 80 responding to the scan line driving pulse sp, and the switch box for data 75 feeds the predetermined data line testing pulse dt to the probe card 80 responding to the data line driving pulse dp.

Figure 2B:
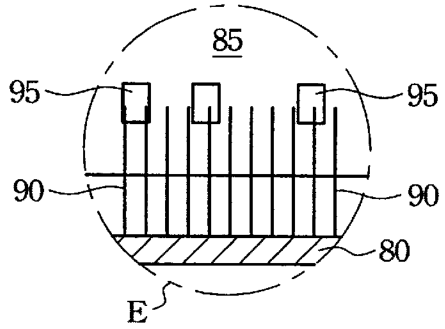
FIG. 2*b* illustrates the amplified view of a portion of the configuration of the testing apparatus according to one preferred embodiment of the present invention.

To further illustrate the operation of testing the LCD panel, the amplified view of the area in the dashed circle E in FIG. 2*a* is shown in FIG. 2*b*. In which a plurality of probe pin 90 is electrically coupled to the edge of probe card 80 respectively, and the other terminal of each of the plurality of probe pin 90 is also electrically coupled to the pad 95 of the LCD panel 85 by physical touching. So the devices in the LCD panel can be tested by the LCD panel testing apparatus through the probe card 80. For the description mentioned above, it is noted that, though the pin number is fixed, yet the number of probe pin 90 of the probe card 85 according to one preferred embodiment of the present invention is more than the number of pad 95 of the LCD panel 85. In addition, the pitch between the probe pins 80 is smaller than the width of the pad 95, so every pad 95 can be electrically coupled to the probe card 80 by the plurality of probe pins 90. FIG. 2*b* is the top view of the configuration of a portion of the preferred embodiment of the present invention shown in FIG. 2*a* within dashed circle E.

Figure 3:
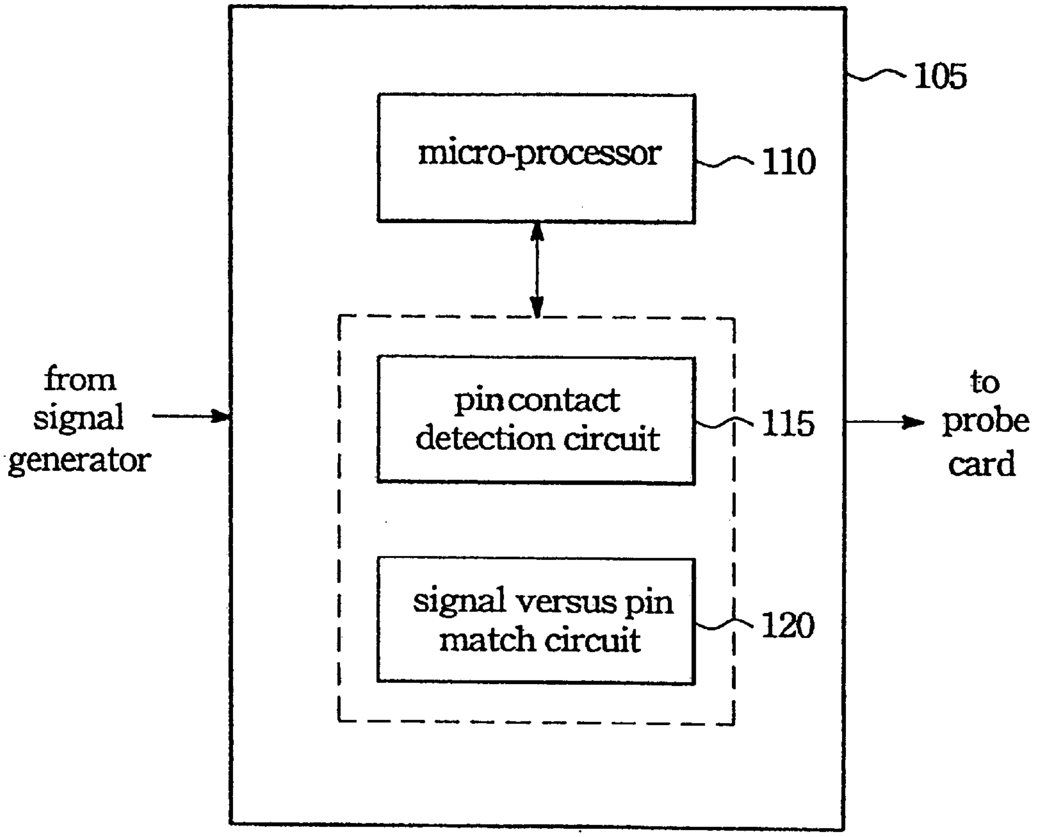
FIG. 3 illustrates the configuration of the switching box utilized in one preferred embodiment of the present invention.

To describe how the display panel testing apparatus according to the preferred embodiment of the present invention, the configuration of the switching box utilized in the preferred embodiment of the present invention is illustrated in FIG. 3. The switching box for scan 70 and the switching box for data 75 are of the same configuration as shown in FIG. 3. As shown in FIG. 3, the switching box 105 includes micro-processor 110, pin contact detection circuit 115, and the signal versus pin match circuit 120. The signal from the signal generator (scan circuit board 60 or the data circuit board 65) is fed to the switch box 105. The switch box 105 detects which probe pin is connected to the pad of the display panel, and determine the mapping between the probe pin in contact with the pad and the signal that is to be sent to the probe pin. The pin contact detection circuit 115 detects which probe pin of the probe card is in contact with the pad of the LCD panel. The signal versus pin match circuit 120 set up the map between the probe pins connected to the pads and the signals that are to be sent to the pads. In other words, the signal versus pin match circuit 120 provides the path between the signals form the signal generator to the plurality of probe pins, which contact with the pads. The micro-processor 110 enables the pin contact detection circuit 115 to detect the which pins are connected to the pads, and the results are sent to the micro-processor 110.

Thus the micro-processor 110 assign the conducting path between the signal generator and the plurality of probe pins. Because the size (number of pin) of the probe card utilized in the preferred embodiment of the present invention is larger than the usual size (number of pads) of the tested display panel. Due to the operation mentioned above, the test signals from the signal generator can be sent to the corresponding pads through the probe pins, thus the test signals can be transmitted from the pins to the devices in the display panel through the corresponding scan bus and data bus. As long as the number of pin of the probe card is greater than the number of pad, the display testing apparatus according to the preferred embodiment of the present invention can be used to test the electrical characteristic of the devices in the display panel of various sizes.

Figure 4:
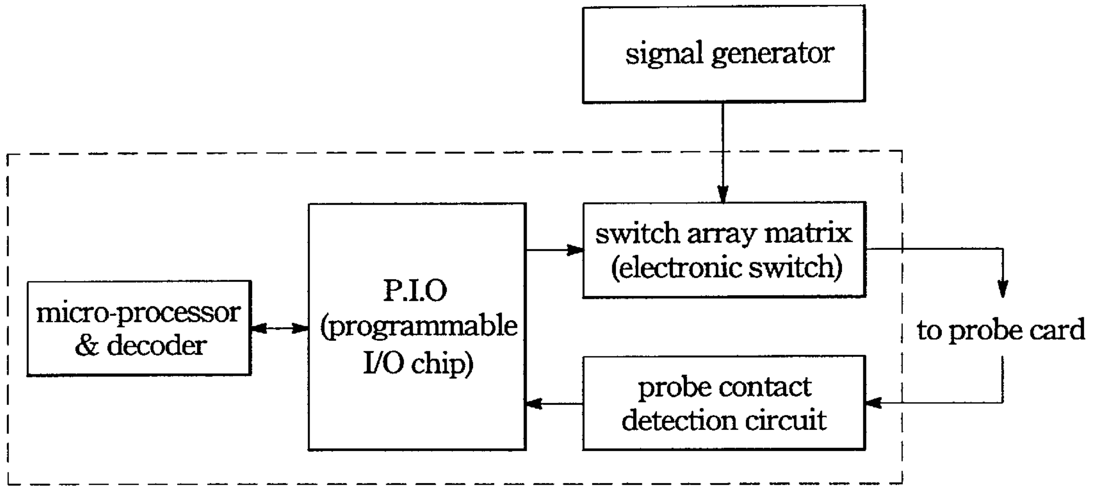
FIG. 4 illustrates one of the practical configurations that can implement the switch box can be used in the present invention.

As the signal versus pin match circuit 120 in the switching box 105 can receive the decoded signal representing the mapping relation between the signal generator to be sent to the display panel and the plurality of probe pins in contact with the plurality of pads according to the result of the pin contact detection circuit 120. So the signal versus pin match circuit 120 can provide the conductive paths between the signal generator and the plurality of probe pins. The signal versus pin match circuit 120 in the preferred embodiment of the present invention can be an electrical switch. As to carry out the practical circuit of the switch box (shown in FIG. 3), it can be implemented in many forms of configuration, and one of the practical configuration is shown in FIG. 4.

As will be understood by persons skilled in the art, the foregoing preferred embodiment of the present invention is illustrative of the present invention rather than limiting the present invention. Having described the invention in connection with a preferred embodiment, for example, if various kinds of display are tested or various configurations of the switch box are utilized in the preferred embodiment. As long as the probe card used to test the display panel has a larger size (number of pins) than that of the tested display panel (number of pads), the modification will now suggest itself to those skilled in the art. While the preferred embodiment of the invention has been illustrated and described, it will be appreciated that various changes can be made therein without departing from the spirit and scope of the invention.

What is claimed is:

1. Testing apparatus for testing an electrical characteristic of devices of a display panel, said testing apparatus comprising:

signal generating means for generating signals that are to be sent to a plurality of pads of said display panel;

switching means for providing a conductive path between said signal generating means and said plurality of pads of said display panel, wherein said plurality of switching means comprises:

contacting detection means detecting which of said plurality of probe pins are in contact with said plurality of pads;

processing means for providing a decoded signal representing a mapping relation between said plurality of electrical signals to be sent to said display panel and said plurality of probe pins in contact with said plurality of pads according to the result of said contacting detection means; and matching means for providing conductive path between said signal generating means and said plurality of pads of said display panel according to said decoded signal;

contacting conductive means for directly feeding said signals to said plurality of pads, said contacting conductive means contacting said plurality of pads, an amount of said contacting conductive means being larger than an amount of said plurality of probe pins, a pitch between any neighboring two of said plurality of probe pins being smaller than a width of each of said plurality of pads of said display panel.

2. Apparatus as claim 1, wherein said display panel is a liquid crystal display panel.

3. Testing apparatus for testing an electrical characteristic of a device of a display panel, said testing apparatus comprising:

a plurality of probe pins for contacting a plurality of pads of said display panel, said testing apparatus being used for sending a plurality of electrical signals to said plurality of pads of said display panel to test the electrical characteristic of the device of said display panel, an amount of said plurality of probe pins being larger than an amount of said plurality of pads, pitches between said plurality of probe pins being smaller than widths between said plurality of pads of said display panel;

signal generating means for generating signals to be sent to said plurality of pads of said display panel through said plurality of probe pins; and switching means for providing a conductive path between said signal generating means and said plurality of probe pins, wherein said plurality of switching means comprises:

contacting detection means detecting which of said plurality of probe pins are in contact with said plurality of pads;

processing means for providing a decoded signal representing a mapping relation between said plurality of electrical signals to be sent to said display panel and said plurality of probe pins in contact with said plurality of pads according to the result of said contacting detection means; and matching means for providing conductive path between said signal generating means and said plurality of pads of said display panel according to said decoded signal.

4. Apparatus as claim 3, wherein said display panel is a liquid crystal display panel.

* * * * *